(12) United States Patent
Kobayashi et al.

(10) Patent No.: US 7,696,595 B2
(45) Date of Patent: Apr. 13, 2010

(54) SEMICONDUCTOR DEVICE AND METHOD FOR MANUFACTURING THE SAME

(75) Inventors: Hiroya Kobayashi, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/573,467

(22) PCT Filed: Sep. 24, 2004

(86) PCT No.: PCT/JP2004/013965
§ 371 (c)(1),
(2), (4) Date: Apr. 13, 2007

(87) PCT Pub. No.: WO2005/031872
PCT Pub. Date: Apr. 7, 2005

(65) Prior Publication Data
US 2007/0272997 A1    Nov. 29, 2007

(30) Foreign Application Priority Data
Sep. 25, 2003    (JP) .............................. 2003-333690

(51) Int. Cl.
*H01L 31/058* (2006.01)
(52) U.S. Cl. ............................... 257/460; 257/E31.038
(58) Field of Classification Search ................. 257/460, 257/E31.032, E31.038; 438/118, 119, 459, 438/64, 65, 977
See application file for complete search history.

(56) References Cited

U.S. PATENT DOCUMENTS

| 5,818,113 | A | 10/1998 | Iseki et al. |
|---|---|---|---|
| 5,918,113 | A * | 6/1999 | Higashi et al. .............. 438/119 |
| 6,201,305 | B1 | 3/2001 | Darveaux et al. |
| 6,204,163 | B1 | 3/2001 | Panchou et al. |
| 6,410,415 | B1 | 6/2002 | Estes et al. |
| 6,571,466 | B1 | 6/2003 | Glenn et al. |
| 6,605,828 | B1 | 8/2003 | Schwarzrock et al. |
| 6,828,657 | B2 | 12/2004 | Hara et al. |

(Continued)

FOREIGN PATENT DOCUMENTS
DE        19848834        7/1999

(Continued)

*Primary Examiner*—Zandra Smith
*Assistant Examiner*—Paul E Patton
(74) *Attorney, Agent, or Firm*—Drinker Biddle & Reath LLP

(57) ABSTRACT

With this semiconductor device, the distortion and cracking of a thinned portion of a semiconductor substrate are prevented to enable high precision focusing with respect to a photodetecting unit and uniformity and stability of high sensitivity of the photodetecting unit to be maintained. A semiconductor device 1 has a semiconductor substrate 10, a wiring substrate 20, conductive bumps 30, and a resin 32. A CCD 12 and a thinned portion 14 are formed on semiconductor substrate 10. Electrodes 16 of semiconductor substrate 10 are connected via conductive bumps 30 to electrodes 22 of wiring substrate 20. Insulating resin 32 fills a gap between outer edge 15 of thinned portion 14 and wiring substrate 20 to reinforce the bonding strengths of conductive bumps 30. This resin 32 is a resin sheet that has been formed in advance so as to surround a periphery of a gap between thinned portion 14 and wiring substrate 20 except for portions of the periphery.

5 Claims, 7 Drawing Sheets

U.S. PATENT DOCUMENTS

| | | |
|---|---|---|
| 7,060,602 B2 * | 6/2006 | Saito ................ 438/612 |
| 7,274,101 B2 | 9/2007 | Tomita et al. |
| 2002/0008315 A1 | 1/2002 | Park |
| 2002/0020859 A1 * | 2/2002 | Muramatsu ................ 257/228 |
| 2002/0084532 A1 | 7/2002 | Neogi et al. |
| 2002/0115278 A1 | 8/2002 | Kawai |

FOREIGN PATENT DOCUMENTS

| | | | |
|---|---|---|---|
| EP | 0 544 294 | | 6/1993 |
| EP | 0 821 408 | | 1/1998 |
| EP | 1 154 457 | | 11/2001 |
| EP | 1 223 612 | | 7/2002 |
| JP | 6-29506 | | 2/1994 |
| JP | 6-196680 | | 7/1994 |
| JP | 11026922 | | 1/1999 |
| JP | 2000-156487 | | 6/2000 |
| JP | 2000/228573 | | 8/2000 |
| JP | 2002/009265 | | 1/2002 |
| JP | 2003-078120 | | 3/2003 |
| JP | 2003-124259 | * | 4/2003 |
| JP | 2003-168792 | | 6/2003 |
| WO | WO 03/028414 | | 4/2003 |

* cited by examiner

SEMICONDUCTOR DEVICE AND METHOD FOR MANUFACTURING THE SAME

TECHNICAL FIELD

This invention concerns a semiconductor device and a method for manufacturing the same, and particularly concerns a back-illuminated semiconductor device and a method for manufacturing the same.

BACKGROUND ART

A so-called back-illuminated semiconductor photodetecting device has been known conventionally as a semiconductor device. This type of semiconductor device has a semiconductor substrate and has a photodetecting unit on one surface of the semiconductor substrate. A portion of the semiconductor substrate on the side opposite the photodetecting unit is trimmed to form a recessed portion in the semiconductor substrate. A thinned portion is thus provided at the portion of the semiconductor substrate at which the photodetecting unit is disposed. This thinned portion is provided to accommodate ultraviolet rays, soft X-rays, electronic beams, and other energy rays that will be absorbed and cannot be detected at high sensitivity by a thick semiconductor substrate. At this thinned portion, light that is made incident on the surface at the recessed portion side of the semiconductor substrate is detected by the photodetecting unit.

As an example of a back-illuminated semiconductor device, there is a semiconductor device that has a BT-CCD (back-thinned CCD). The BT-CCD is used as a detecting unit of a semiconductor inspecting device. An example of a conventional semiconductor device having a BT-CCD is described in Patent Document 1.

FIG. 7 is a sectional view of an arrangement of the semiconductor device described in Patent Document 1. As shown in FIG. 7, a P-type silicon layer 104, which is a semiconductor substrate having a CCD 103 on a surface that opposes a wiring substrate 102, is mounted via metal bumps 105 onto wiring substrate 102, which is fixed to a bottom portion of the interior of a package 101. Each wiring 106 on wiring substrate 102 is connected at one end to a metal bump 105 and has a bonding pad (not shown) for externally taking out detected signals at the other end, and each bonding pad is electrically connected by a bonding wire 107 to a lead terminal (not shown) of package 101. Furthermore, a gap between wiring substrate 102 and P-type silicon layer 104 is filled with an underfill resin 108 for reinforcing the bonding strengths of metal bumps 105.

Patent Document 1: Japanese Published Unexamined Patent Application No. Hei 6-196680

However, when the underfill resin fills the gap between the wiring substrate and the thinned portion of the semiconductor substrate as shown in FIG. 7, the thinned portion may crack due to the stress that arises due to a thermal expansion coefficient difference between the underfill resin and the semiconductor substrate in the process of heating or cooling to cure the underfill resin. Even if cracking does not occur, the thinned portion may become distorted by being pulled by the contraction of the underfill resin. Such distortion of the thinned portion of the semiconductor substrate may bring about adverse effects on focusing with respect to the photodetecting unit and uniformity and stability of sensitivity of the photodetecting unit during use of the semiconductor device.

This invention was made in view of the above issue and an object thereof is to provide a semiconductor device, with which the distortion and cracking of a thinned portion of a semiconductor substrate are prevented to enable high precision focusing with respect to a photodetecting unit and uniformity and stability of high sensitivity of the photodetecting unit to be maintained.

DISCLOSURE OF THE INVENTION

In order to achieve the above object, this semiconductor device comprises: a semiconductor substrate, having a photodetecting unit formed on one surface, a thinned portion formed by etching a region, opposing the photodetecting unit, of another surface, and first electrodes disposed on the one surface at an outer edge of the thinned portion and electrically connected to the photodetecting unit; a wiring substrate, disposed to oppose the one surface side of the semiconductor substrate and having second electrodes connected via conductive bumps to the first electrodes; and a resin, filling a gap between the wiring substrate and the outer edge of the thinned portion to reinforce the strengths of bonding of the respective first electrodes and the respective second electrodes with the conductive bumps; and wherein the resin is a resin sheet that is formed in advance so as to surround a periphery of a gap between the thinned portion and the wiring substrate except for portions of the periphery.

With this semiconductor device, the resin fills the gap between the wiring substrate and the outer edge of the thinned portion. The strength of bonding of the conductive bumps with the first electrodes that are disposed at the outer edge of the thinned portion and the strength of bonding of the conductive bumps with the second electrodes of the wiring substrate are thus reinforced. Meanwhile, because the resin does not fill a gap between the wiring substrate and the thinned portion of the semiconductor substrate, even when stress due to the thermal expansion coefficient difference between the resin and the semiconductor substrate arises during heating or cooling in the process of curing the resin, etc., the influence of the stress on the thinned portion will be small and distortion and cracking of the thinned portion will be prevented. Thus with this semiconductor device, high precision focusing is enabled with respect to the photodetecting unit and uniformity and stability of high sensitivity of the photodetecting unit can be exhibited during use.

Furthermore, as the above-mentioned resin, the resin sheet, which is formed in advance to a desired shape, that is, a shape that surrounds the periphery of the gap between the thinned portion and the wiring substrate except for portions of the periphery, is used. An arrangement, wherein the resin fills the gap at which the conductive bumps exist, that is, the gap between the outer edge of the thinned portion and the wiring substrate while the gap between the wiring substrate and the thinned portion is left unfilled, can thus be realized readily and reliably.

A sealed space may form when the gap between the thinned portion and the wiring substrate is completely surrounded by the resin. In this case, the thinned portion may become distorted due to expansion or contraction of the air inside the sealed space during heating or cooling in the process of curing the resin, etc. In regard to this issue, with the present semiconductor device, the arrangement wherein the resin surrounds the periphery of the gap except at portions of the periphery is provided to prevent the gap from becoming sealed. Moreover, by use of the resin sheet formed in advance, this arrangement can also be realized readily and reliably.

The photodetecting unit may have a plurality of pixels that are arrayed one-dimensionally or two-dimensionally. This invention's semiconductor device is especially useful in this case because uniformity and stability of high sensitivity is required among the plurality of pixels.

A semiconductor device manufacturing method of this invention comprises the steps of: preparing a semiconductor substrate, having a photodetecting unit formed on one surface, a thinned portion formed by etching a region, opposing the photodetecting unit, of another surface, and first electrodes disposed on the above-mentioned one surface at an outer edge of the thinned portion and electrically connected to the photodetecting unit; preparing a wiring substrate, disposed to oppose the above-mentioned one surface side of the semiconductor substrate and having second electrodes connected via conductive bumps to the first electrodes; adhering a solid resin sheet onto a predetermined region on the above-mentioned other surface of the semiconductor substrate; and thermocompression bonding the semiconductor substrate, with the resin sheet, to the wiring substrate; and the predetermined region is set to surround a periphery of a gap between the thinned portion and the wiring substrate except for portions of the periphery.

In this case, the semiconductor device with the above-mentioned functions can be manufactured readily by adhering on the resin sheet.

By this invention, a semiconductor device can be realized with which the distortion and cracking of a thinned portion of a semiconductor substrate are prevented to enable high precision focusing with respect to a photodetecting unit and uniformity and stability of high sensitivity of the photodetecting unit to be maintained.

EXPLANATION OF REFERENCE NUMERALS

Figure 1:
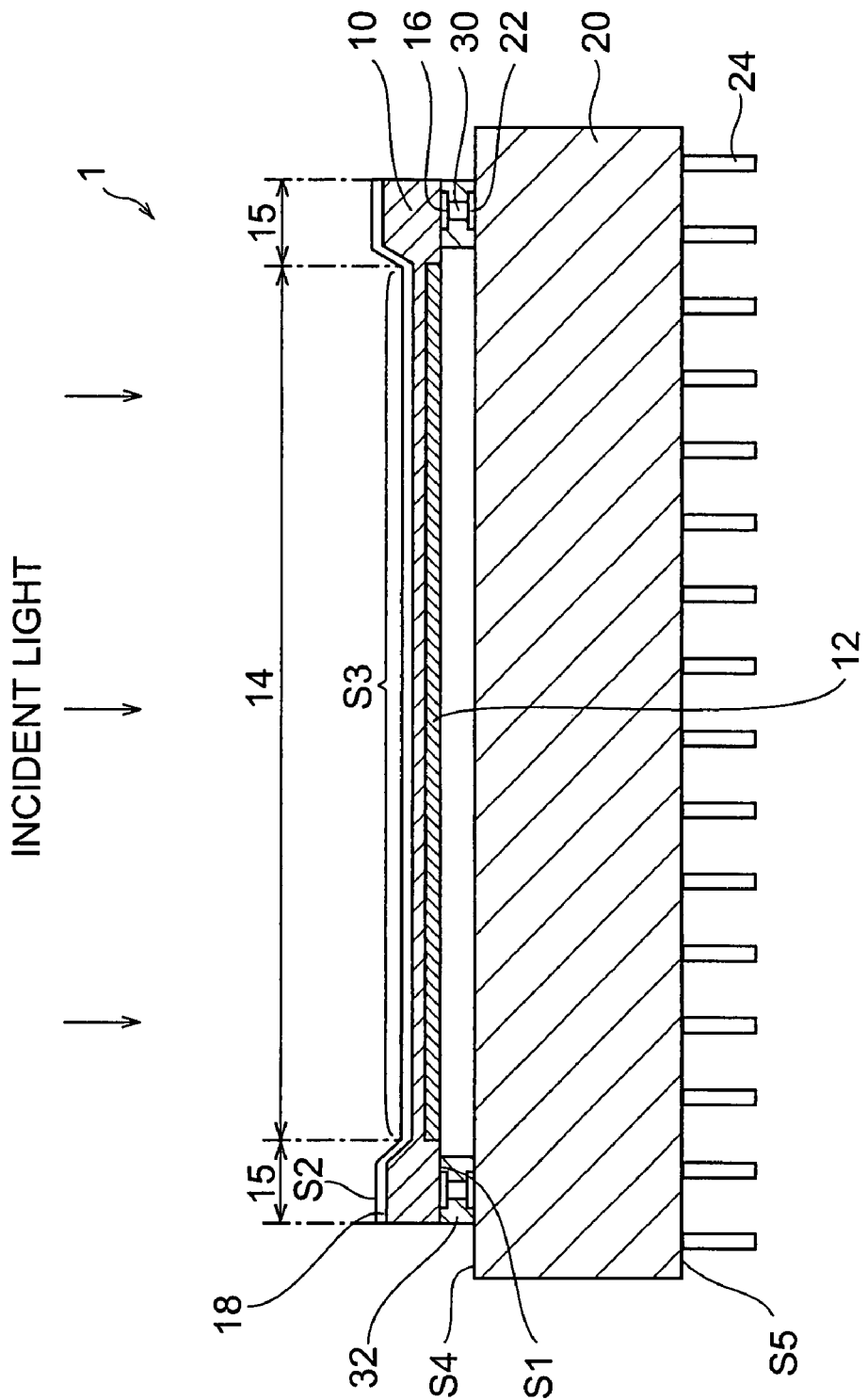
FIG. 1 is a sectional view of an embodiment of this invention's semiconductor device.

1 . . . semiconductor device
10 . . . semiconductor substrate
14 . . . thinned portion
15 . . . outer edge
16 . . . electrode
18 . . . accumulation layer
20 . . . wiring substrate
22 . . . electrode
24 . . . lead terminal
28 . . . chip resistor
30 . . . conductive bumps
32 . . . resin
34 . . . communicating portion

BEST MODES FOR CARRYING OUT THE INVENTION

Preferred embodiments of this invention's semiconductor device shall now be described in detail along with the drawings. In the description of the drawings, the same elements shall be provided with the same symbols and overlapping description shall be omitted. The dimensional proportions in the drawings do not necessary match those of the description.

FIG. 1 is a sectional view of an embodiment of this invention's semiconductor device. A semiconductor device 1 has a semiconductor substrate 10, a wiring substrate 20, conductive bumps 30, and a resin 32. Semiconductor substrate 10 is a BT-CCD (back-thinned CCD) and has a CCD 12 formed as a photodetecting unit on a portion of a top layer of its front surface S1 side. Semiconductor substrate 10 includes, for example, a silicon $P^+$ layer, a P-type epitaxial layer formed above the silicon $P^+$ layer, and an unillustrated set of transfer electrodes, formed on the epitaxial layer and to which driving signals are provided. CCD 12 has a plurality of pixels that are arrayed two-dimensionally. Also, a thinned portion 14 is formed by thinning by etching a region, opposing CCD 12, of a back surface S2. The etched portion has a truncated rectangular pyramidal profile. A surface of thinned portion 14 at the etched side is a flat and rectangular, light-incident surface S3, and this light-incident surface S3 is formed to be substantially the same in size as CCD 12. Semiconductor substrate 10 as a whole has a rectangular shape in plan view. Semiconductor substrate 10 is, for example, approximately 15 to 40 μm thick at thinned portion 14 and approximately 300 to 600 μm thick at an outer edge 15 of thinned portion 14. Outer edge 15 of thinned portion 14 refers to a portion of semiconductor substrate at the periphery of thinned portion 14 and is thicker than thinned portion 14.

Electrodes 16 (first electrodes) are formed on front surface S1 of outer edge 15. These electrodes 16 are electrically connected to the set of transfer electrodes of CCD 12 by wirings that are omitted from illustration. The entirety of back surface S2 of semiconductor substrate 10, including light-incident surface S3, is covered by an accumulation layer 18. Accumulation layer 18 is of the same conductive type as semiconductor substrate 10, however, is higher in impurity concentration than semiconductor substrate 10.

Semiconductor substrate 10 is mounted onto wiring substrate 20 by flip-chip bonding. Wiring substrate 20 is thus positioned to oppose the front surface S1 side of semiconductor substrate 10. Electrodes 22 (second electrodes) are formed at positions of wiring substrate 20 that oppose electrodes 16 of semiconductor substrate 10, and these electrodes 22 are connected via conductive bumps 30 to electrodes 16. Lead terminals 24, electrodes 22, conductive bumps 30, and electrodes 16 are thus connected to the CCD transfer electrodes and CCD drive signals are input into lead terminals 24. An output of an amplifier that outputs a CCD read signal is taken out from a lead terminal 24 via an electrode 16, a conductive bump 30, and an electrode 22. Wiring substrate 20 is formed, for example, of a multilayer ceramic substrate. An upper surface S4 (surface opposing semiconductor substrate 10) of wiring substrate 20 has a wider area than semiconductor substrate 10 and a region that does not oppose semiconductor substrate exists at an edge of upper surface S4.

Lead terminals 24 are disposed at a bottom surface S5 (surface at the opposite side of upper surface S4) of wiring substrate 20. Lead terminals 24 are connected to internal wirings (not shown) of wiring substrate 20.

Due to the interposition of conductive bumps 30, a gap exists between semiconductor substrate 10 and wiring substrate 20. Of this gap, a portion that is sandwiched by outer edge 15 and wiring substrate 20 is filled with insulating resin 32 (underfill resin) for reinforcing the bonding strengths of conductive bumps 30 (specifically the strengths of bonding of conductive bumps 30 with the respective electrodes 16 and electrodes 22). Resin 32 is a resin sheet, and as this sheet, a resin sheet, with which, for example, an epoxy-based resin, a urethane-based resin, a silicone-based resin, an acrylic-based resin, or a composite of such resins is formed to a sheet form, may be used.

Figure 2:
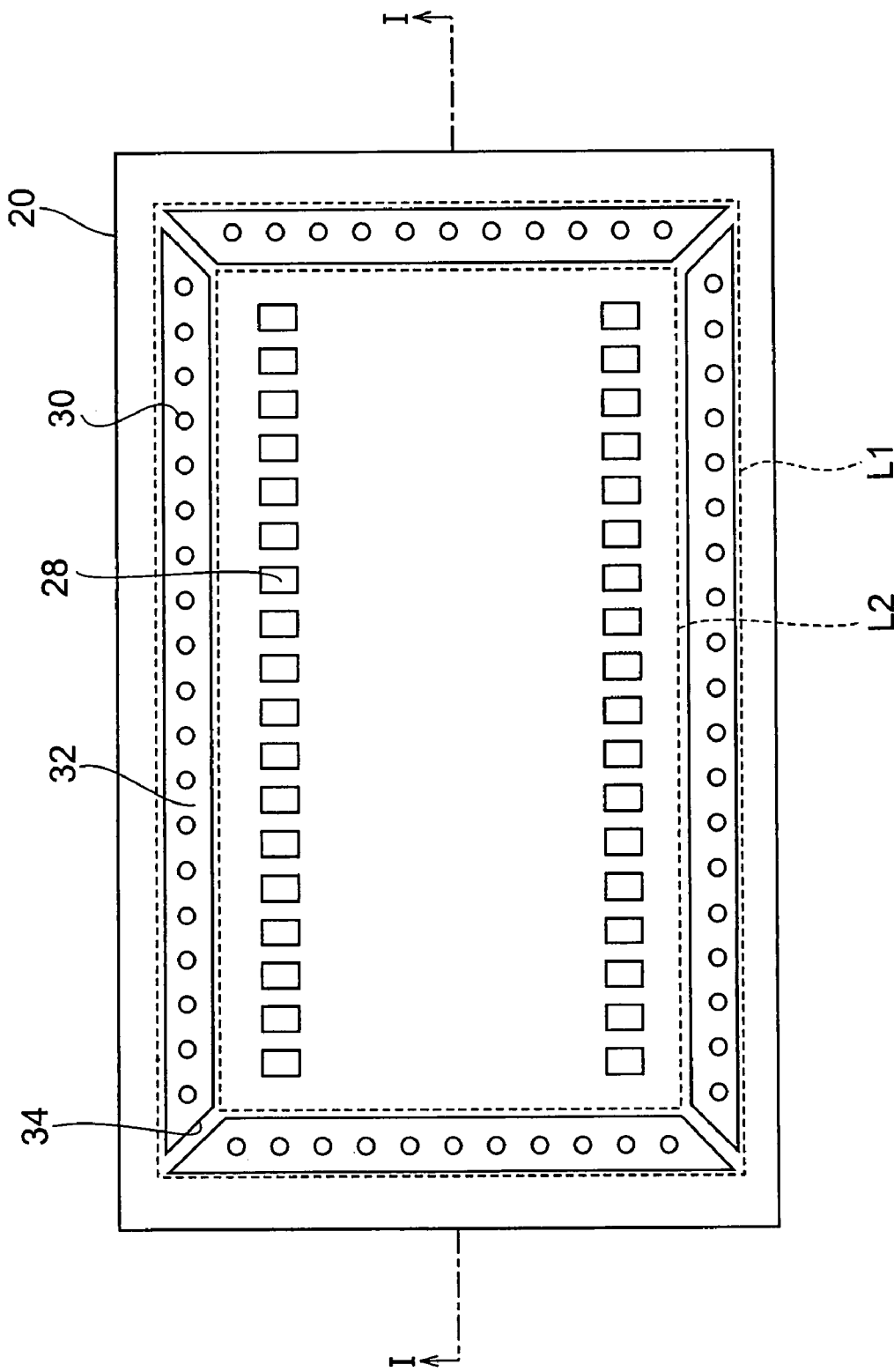
FIG. 2 is a plan view for describing an arrangement of resin 32 of FIG. 1.

The arrangement of resin 32 shall now be described in detail using FIG. 2. FIG. 2 is a plan view of wiring substrate 20 as viewed from its upper surface S4 side. In FIG. 2, broken lines L1 and L2 indicate outlines of semiconductor substrate 10 and thinned portion 14, respectively. The sectional view along line I-I of this figure corresponds to being FIG. 1. As shown in this figure, although resin 32 surrounds a periphery of a gap between thinned portion 14 of semiconductor substrate 10 and wiring substrate 20, it does not surround the entire periphery but surrounds the periphery with the exception of portions of the periphery. Specifically, resin 32 is disposed while leaving regions respectively extending from the four corners of a region of wiring substrate 20 that opposes the thinned portion (the rectangular region surrounded by broken lines L2) to the outer side of a region opposing semiconductor substrate 10. Communicating portions 34 that put the gap between thinned portion 14 and wiring substrate 20 in communication with the exterior of semiconductor device 1 are thus defined at the gap between semiconductor substrate 10 and wiring substrate 20.

Furthermore, a plurality of chip resistors 28 are disposed on upper surface S4 of wiring substrate 20. Chip resistors 28 are aligned one-dimensionally in the left/right direction of the figure, respectively at an upper portion and a lower portion in the figure in the region of wiring substrate 20 that opposes thinned portion 14.

Returning now to FIG. 1, operations of semiconductor device 1 shall be described. Light made incident on thinned portion 14 of semiconductor substrate 10 from light-incident surface S3 is detected by CCD 12. The detected signals pass through electrodes 16, conductive bumps 30, electrodes 22, in that order, and are thereby transmitted to wiring substrate 20. The detected signals (CCD read signals) are then transmitted to lead terminals 24 and output from lead terminals 24 to the exterior of semiconductor device 1.

The effects of semiconductor device 1 shall now be described. Resin 32 fills the gap between outer edge 15 of thinned portion 14 and wiring substrate 20. The strength of bonding of electrodes 16, disposed on outer edge 15 of thinned portion 14, with conductive bumps 30 and the strength of bonding of conductive bumps 30 with electrodes 22 of wiring substrate 20 are thereby reinforced. Meanwhile, because the gap between thinned portion 14 of semiconductor substrate 10 and wiring substrate 20 is not filled with resin 32, even if stress due to the thermal expansion coefficient difference between resin 32 and semiconductor substrate 10 arises between the two during heating or cooling in the process of curing resin 32, etc., the influence of the stress on thinned portion 14 will be low and distortion and cracking of thinned portion 14 are prevented. Thus with semiconductor device 1, high precision focusing with respect to CCD 12 is enabled and uniformity and stability of the high sensitivity of CCD 12 can be exhibited during use. Also, because cracking of thinned portion 14 is prevented, the manufacturing yield of semiconductor device 1 is improved.

Furthermore, as resin 32, a resin sheet that has been formed in advance to a desired shape, that is, a shape that surrounds the periphery of the gap between thinned portion 14 and the wiring substrate 20 except for portions of the periphery, is used. The arrangement, wherein resin 32 fills the gap at which conductive bumps 30 exist, that is, the gap between the outer edge of thinned portion 14 and wiring substrate 20 while the gap between thinned portion 14 and wiring substrate 20 is left unfilled, can thus be realized readily and reliably.

A sealed space may form when the gap between thinned portion 14 and wiring substrate 20 is completely surrounded by the resin 32. In this case, thinned portion 14 may become distorted due to expansion or contraction of the air inside the sealed space during heating or cooling in the process of curing the resin, etc. In regard to this issue, with semiconductor device 1, the arrangement, wherein resin 32 surrounds the periphery of the gap except at portions of the periphery, is provided to prevent the gap from becoming sealed. Moreover, by use of the resin sheet formed in advance, this arrangement can also be realized readily and reliably.

Semiconductor substrate 10 is provided with accumulation layer 18. The accumulation state of semiconductor substrate 10 is thereby maintained. Thereby the uniformity and stability of the sensitivity of CCD 12 with respect to short wavelength light can be improved further.

Figure 7:
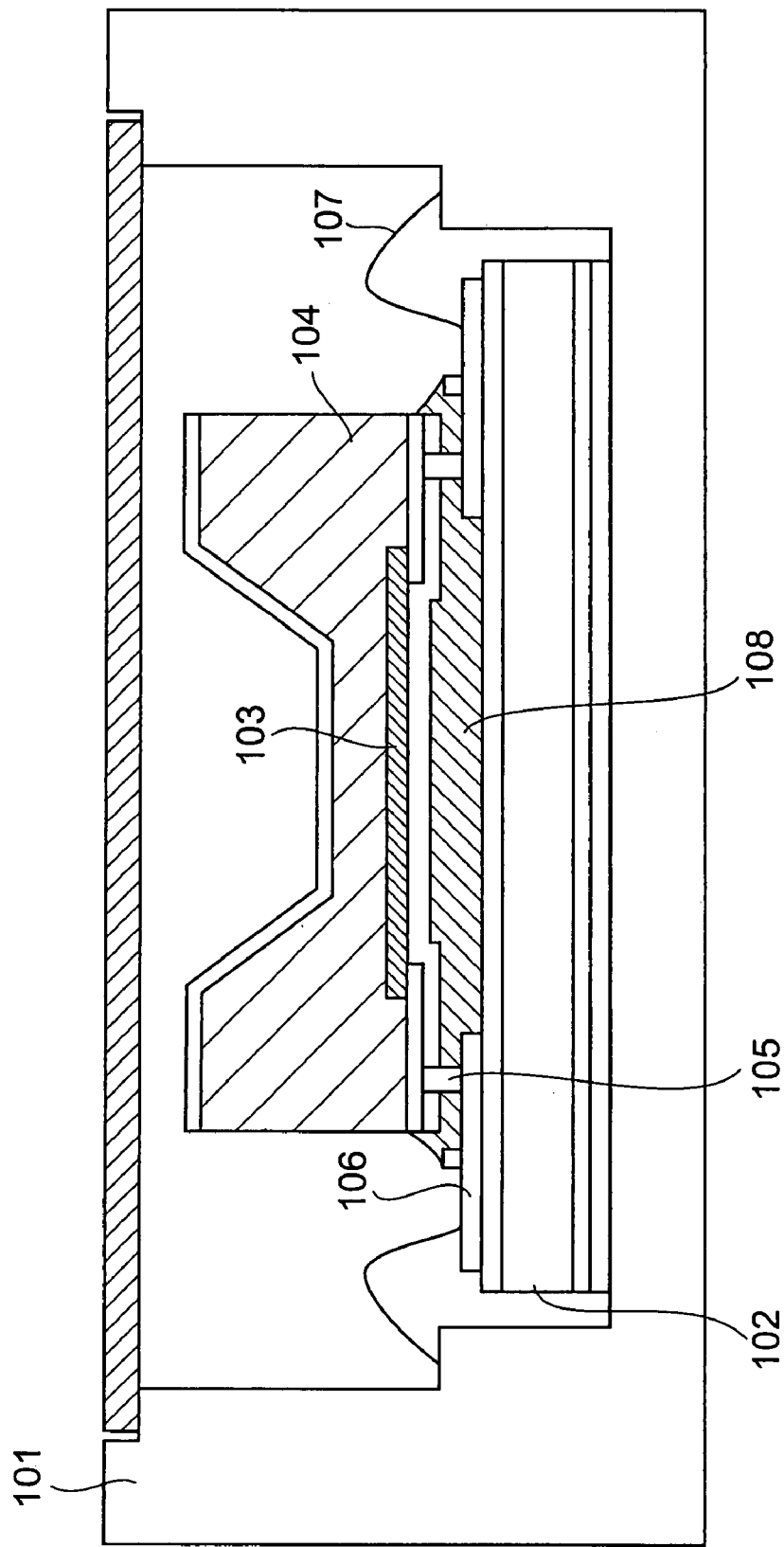
FIG. 7 is a sectional view of an arrangement of a conventional semiconductor device.

In recent years, demands for large area and high-speed response characteristics have been increasing for back-illuminated semiconductor devices. However, with an arrangement, such as that of the semiconductor device shown in FIG. 7, wherein the semiconductor substrate is die bonded once to the wiring substrate and then the wiring substrate is wire bonded to the lead terminals of the package, it is difficult to realize a large area and a high-speed response at the same time. That is, when the semiconductor device of this arrangement is made large in area, the resistance increases due to the accompanying elongation of the wires. Moreover, because in accordance with the making of the area large, the occurrence of crosstalk, the forming of capacitance (capacitor) between the wires, and other issues arise due to wires becoming close to each other and high in density, the realization of high-speed response is made even more difficult.

Meanwhile, with semiconductor device 1, because semiconductor substrate 10 is mounted onto wiring substrate 20 via conductive bumps 30, there is no need to perform wire bonding of semiconductor substrate 10 with wiring substrate 20. Furthermore, because wiring substrate 20 is provided with lead terminals 24, there is no need to provide a package besides wiring substrate 20 and thus, with semiconductor device 1, there is no need to perform wire bonding of wiring substrate 20 with lead terminals of a package. Thus with semiconductor device 1, because all of the wirings can be arranged without using wire bonding, even if a large area is to be realized, the above-mentioned problems of increased resistance, occurrence of crosstalk, and forming of capacitance do not occur. Semiconductor device 1 can thus meet the demands of both large area and high-speed response. For example, when the number of pixels of CCD 12 is 2054 pixels×1024 pixels (with the chip size (area of semiconductor substrate 10) being slightly over 40.0 mm×20 mm), whereas speeding up of the response to a rate of 1.6 Gpixels/sec or more is difficult with the conventional semiconductor device, high-speed operation at 3.2 Gpixels/sec is enabled with semiconductor device 1.

Figure 3:
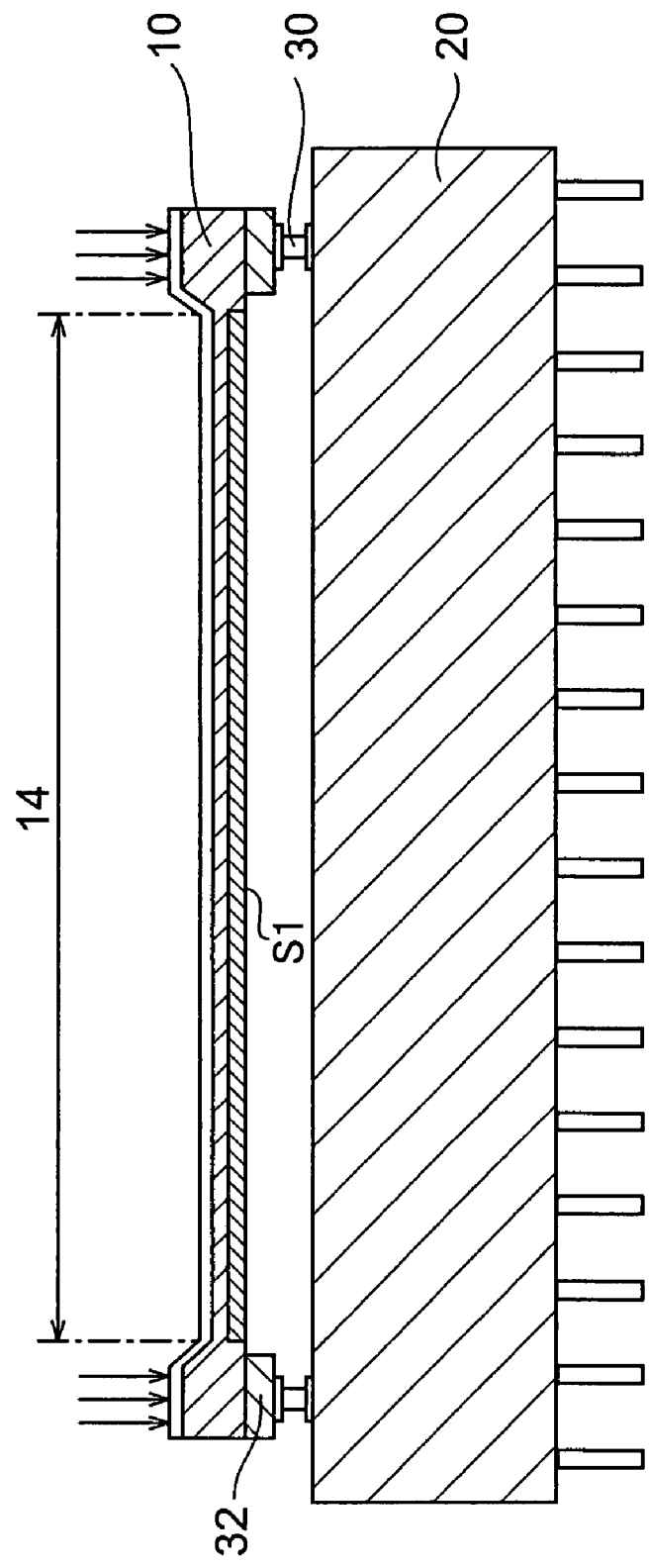
FIG. 3 is a sectional view for describing an example of a method of manufacturing semiconductor device 1 of FIG. 1.

FIG. 3 is a sectional view for describing an example of a method for manufacturing semiconductor device 1 of FIG. 1. In this example, a solid transfer sheet (resin sheet) is used as resin 32, and this solid transfer sheet is adhered onto a predetermined region of front surface S1 of semiconductor substrate 10. This predetermined region is a region that surrounds the periphery of thinned portion 14 except for portions of the periphery. Thereafter, by thermocompression bonding semiconductor substrate 10 onto wiring substrate 20, semiconductor device 1, shown in FIG. 1, is obtained. Since bumps 30 pierce the solid transfer sheet in the thermocompression bonding process, there is no need to form openings, etc., in advance at portions of the solid transfer sheet corresponding to bumps 30.

Figure 4:
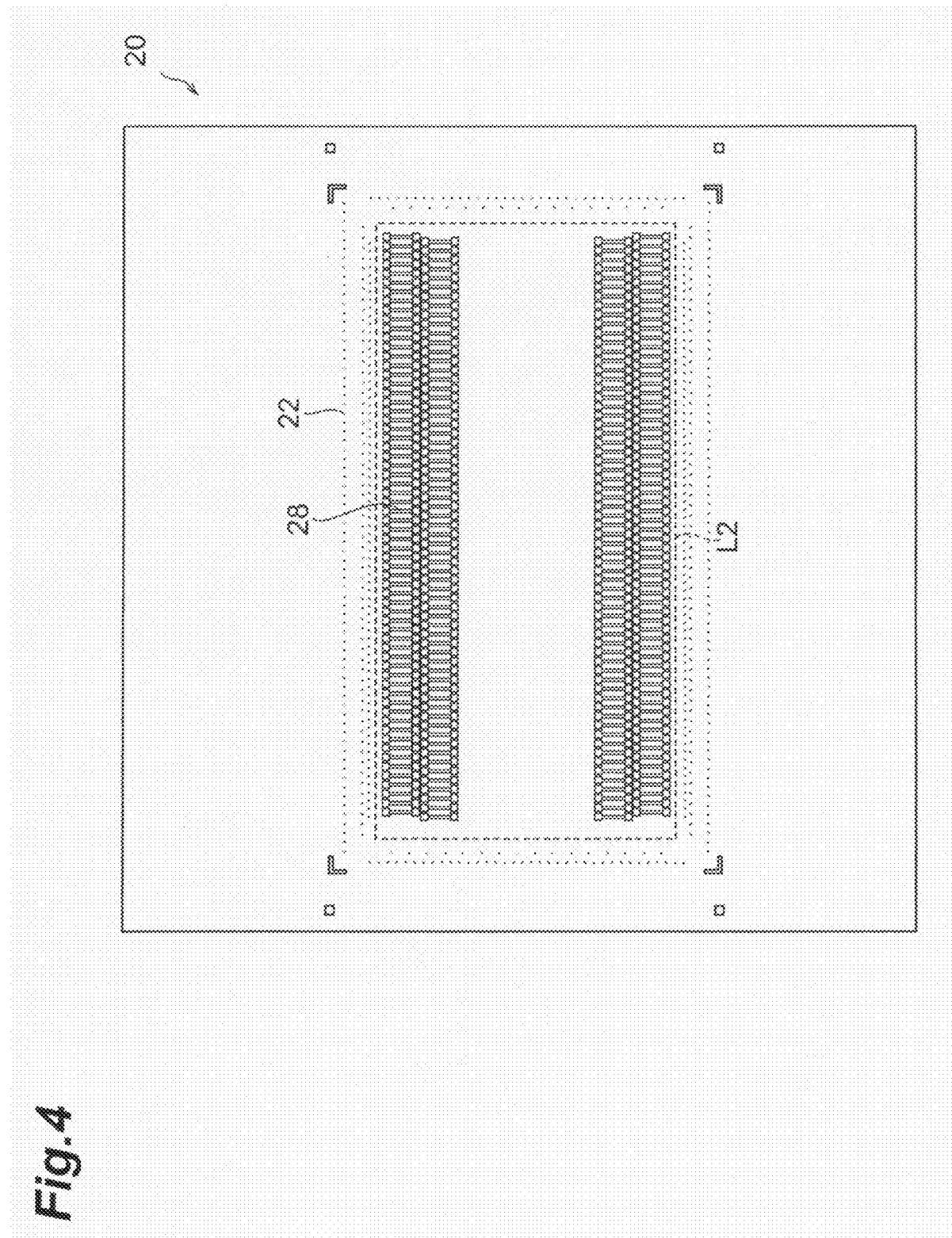
FIG. 4 is a plan view of an arrangement example of wiring substrate 20 of FIG. 1.

FIG. 4 is a plan view of an arrangement example of wiring substrate 20 of FIG. 1. Wiring substrate 20 of this arrangement example is a multilayer ceramic substrate. This wiring substrate 20 has a substantially square shape of 58.420 mm square in plan view. The plurality of chip resistors 28 are disposed in the rectangular region (indicated by broken lines L2) of wiring substrate 20 that opposes thinned portion 14. In this region, chip resistors 28 are aligned one-dimensionally in the left/right direction of the figure (in the direction of the long sides of the rectangle) in two columns at each of an upper portion and a lower portion in the figure. The plurality of electrodes 22 are formed in a region at the outer side of the region. Electrodes 22 are aligned along each of the four sides of the rectangle, forming three columns along each of the long sides and forming two columns along each of the short sides. The diameter of each electrode 22 is 0.080 mm.

Figure 5:
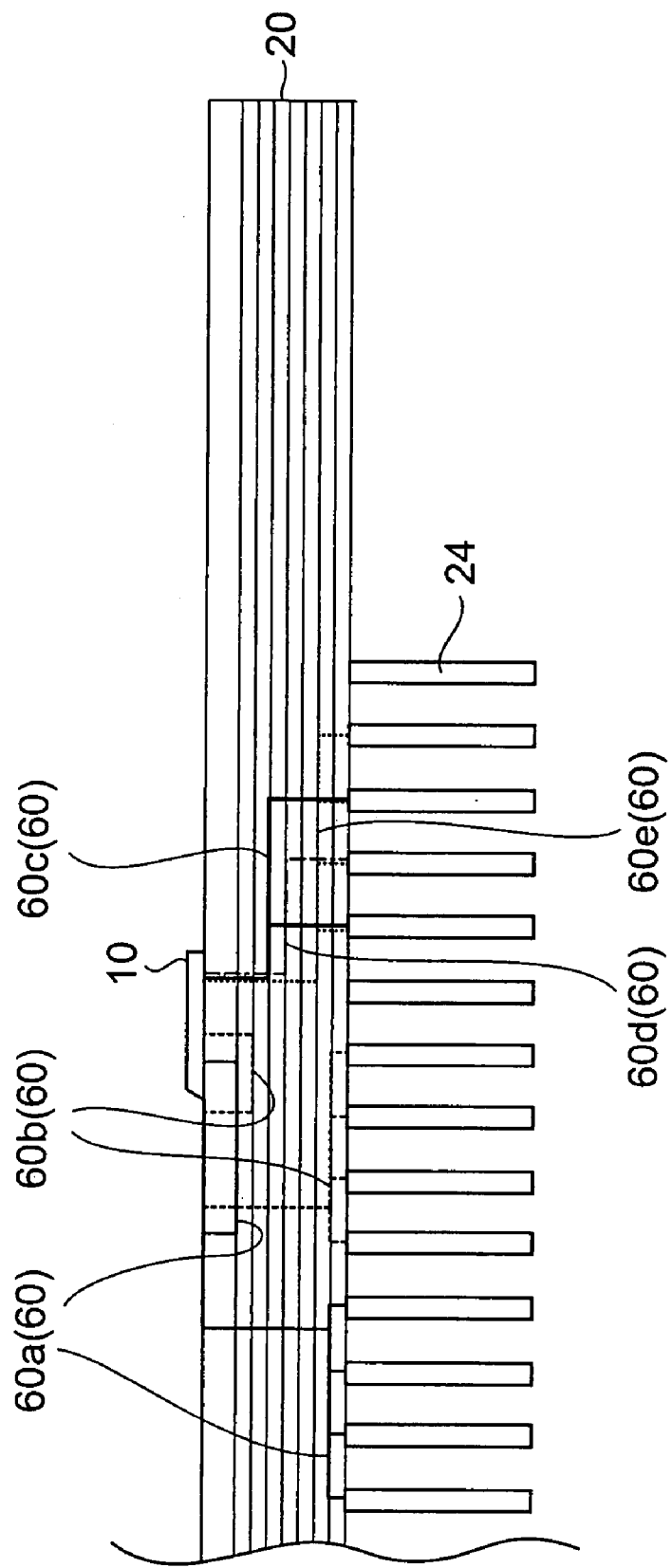
FIG. 5 is a sectional view of an arrangement of internal wirings of wiring substrate 20 of the arrangement example of FIG. 4.
Figure 6:
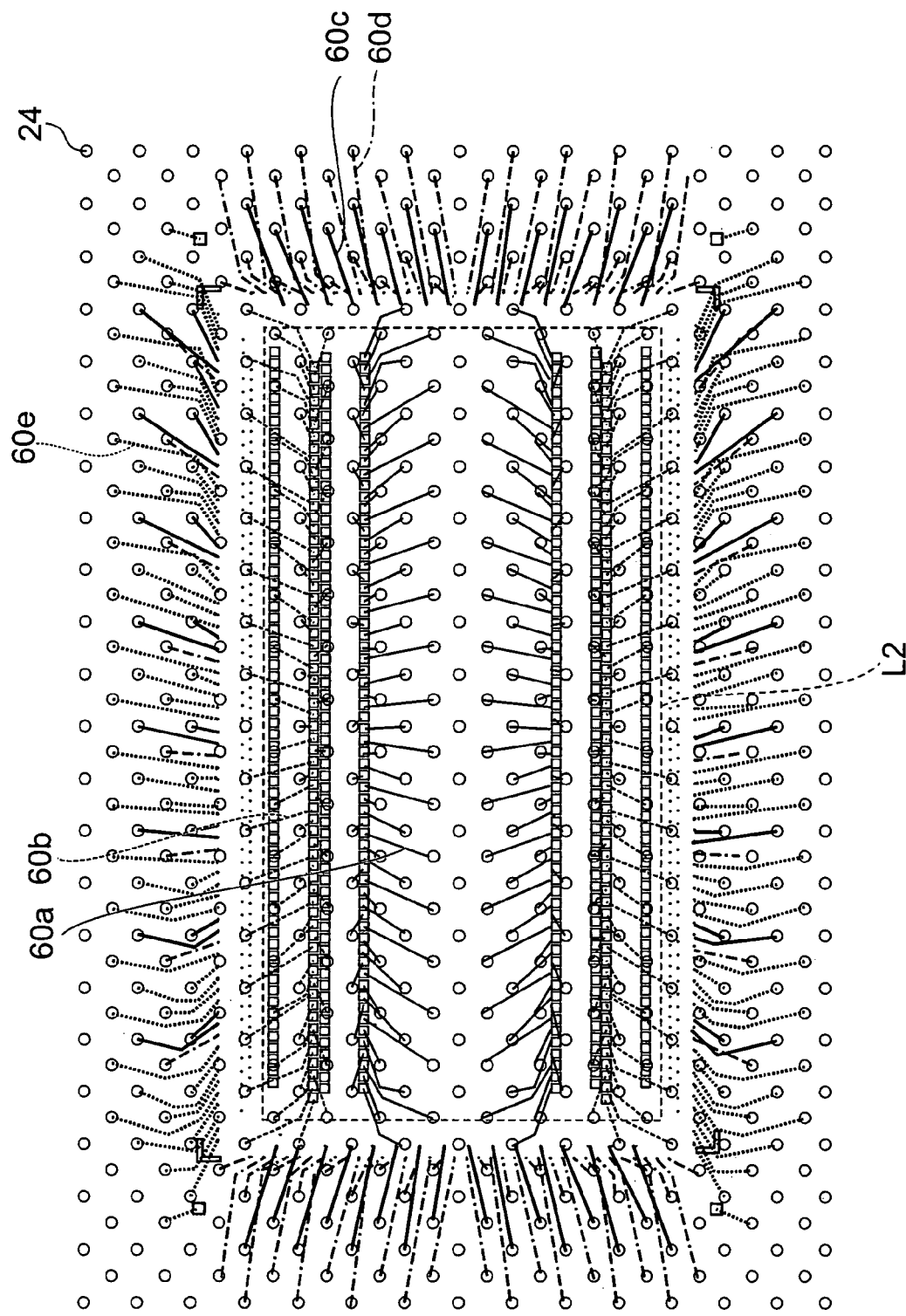
FIG. 6 is a sectional view for describing the arrangement of internal wirings 60 of FIG. 5.

FIG. 5 is a sectional view of an arrangement of internal wirings of wiring substrate 20 of the arrangement example of FIG. 4. Internal wirings 60 include signal output wirings 60a and 60b, clock supplying wirings 60c and 60d, and DC bias (ground) supplying wirings 60e. Each internal wiring 60 electrically connects an electrode 22, a lead terminal 24, and a chip resistor 28 to each other. The arrangement of internal wirings 60 shall now be described in more detail using FIG. 6. In FIG. 6, lead terminals 24 are indicated overlappingly on a plan view of wiring substrate 20 for the sake of description. As shown in this figure, whereas only signal output wirings 60a and 60b are formed inside the region opposing thinned portion 14, clock supplying wirings 60c and 60d and DC bias (clock) supplying wiring 60e are formed outside the region. By thus positioning the driving system wirings such as clock supplying wirings 60c and 60d and DC bias supplying wiring 60e separately from signal output wirings 60a and 60b, the occurrence of crosstalk between the driving system signals and the output system signals can be prevented.

INDUSTRIAL APPLICABILITY

This invention can be applied to a semiconductor device and a method of manufacturing the same and particularly to a back-illuminated semiconductor device and a method for manufacturing the same.

The invention claimed is:

1. A back-illuminated semiconductor device comprising:
a semiconductor substrate, having:
   a photodetecting unit formed on one surface,
   a thinned portion formed by etching a region, opposing the photodetecting unit, of another surface,
   an outer edge surrounding the thinned portion, and
   first electrodes disposed on the one surface at the outer edge and electrically connected to the photodetecting unit;
a wiring substrate, disposed to oppose the one surface side of the semiconductor substrate and having second electrodes connected via conductive bumps to the first electrodes; and
a resin, filling a gap between the wiring substrate and the outer edge with the conductive bumps; and
wherein the resin is a resin sheet,
wherein a communicating portion is formed so as to laterally penetrate through the resin sheet,
wherein the first and second electrodes surround a space between the wiring substrate and the thinned portion of the semiconductor,
wherein the resin sheet surrounds said space, and
wherein the communicating portion penetrating the resin sheet is configured to allow air communication in it.

2. The semiconductor device according to claim 1,
wherein the resin sheet has four corners,
wherein there are other communicating portions laterally penetrating the resin sheet, and
wherein the communicating portions are respectively arranged at the four corners of the resin sheet.

3. The semiconductor device according to claim 1,
wherein the communicating portion is not sealed.

4. The semiconductor device according to claim 1, further comprising:
a plurality of chip resistors disposed on a region of the wiring substrate, wherein the region on which the plurality of chip resistors are disposed opposes the thinned portion.

5. The semiconductor device according to claim 4,
wherein the plurality of chip resistors are aligned one-dimensionally.

* * * * *